United States Patent
Khodadadi et al.

(10) Patent No.: US 9,873,110 B2
(45) Date of Patent: Jan. 23, 2018

(54) METHOD FOR DEPOSITION OF NOBLE METAL NANOPARTICLES ON CATALYSTS TO PROMOTE SAME, AND THE COMPOSITIONS SO PRODUCED

(71) Applicant: Sensiran, Tehran (IR)

(72) Inventors: Abbas Ali Khodadadi, Tehran (IR); Yadollah Mortazavi, Tehran (IR); Mohammad Javad Parnian, Shahryar (IR); Ali Taheri Najafabadi, Tehran (IR)

(73) Assignee: SENSIRAN, Tehran (IR)

( * ) Notice: Subject to any disclaimer, the term of this patent is extended or adjusted under 35 U.S.C. 154(b) by 42 days.

(21) Appl. No.: 14/534,103

(22) Filed: Nov. 5, 2014

(65) Prior Publication Data

US 2015/0133293 A1    May 14, 2015

Related U.S. Application Data

(60) Provisional application No. 61/902,157, filed on Nov. 9, 2013.

(51) Int. Cl.
| | |
|---|---|
| B01J 23/75 | (2006.01) |
| B01J 23/89 | (2006.01) |
| C23C 16/455 | (2006.01) |
| B01J 37/34 | (2006.01) |

(Continued)

(52) U.S. Cl.
CPC ......... B01J 23/8913 (2013.01); B01J 35/002 (2013.01); B01J 35/004 (2013.01); B01J 35/0013 (2013.01); B01J 37/34 (2013.01); C23C 16/18 (2013.01)

(58) Field of Classification Search
CPC ....... B01J 23/8913; B01J 23/75; C23C 16/18; C23C 16/455
See application file for complete search history.

(56) References Cited

U.S. PATENT DOCUMENTS

| | | | |
|---|---|---|---|
| 2007/0026654 A1* | 2/2007 | Huotari | H01L 21/28079 438/585 |
| 2010/0166815 A1* | 7/2010 | Mailley | C23C 16/30 424/405 |

(Continued)

OTHER PUBLICATIONS

Miura et al., "Preparation of supported bimetallic catalysts by means of selective deposition using mobile metal compounds as precursors," Catalysis Today 38(3), pp. 215-221, May 1996.*

(Continued)

*Primary Examiner* — Jun Li
(74) *Attorney, Agent, or Firm* — NovoTechIP International PLLC

(57) ABSTRACT

A method for promoting the supported catalysts using noble metal nanoparticles. Different noble metal precursors are preferentially deposited onto the supported metal catalysts through Chemical vapor deposition (CVD), and compositions so produced. Further, the promoted catalyst is used for CO and $CO_2$ hydrogenation reactions, increasing the reaction conversion, $C_{5+}$ compounds selectivity and chain growth probability. The active phase of catalyst can be either cobalt oxide, nickel oxide or their reduced format ($Co^0$ or $Ni^0$), and the noble metal is preferably Ruthenium.

11 Claims, 5 Drawing Sheets

(51) Int. Cl.
*B01J 35/00* (2006.01)
*C23C 16/18* (2006.01)

(56) References Cited

U.S. PATENT DOCUMENTS

2011/0263910 A1* 10/2011 Johnston ............... C07C 29/149
568/885
2014/0087937 A1* 3/2014 Liu .......................... B01J 31/38
502/11

OTHER PUBLICATIONS

Cronauer et al., "Fischer-Tropsch Synthesis: Preconditioning Effects upon Co-Containing Promoted and Unpromoted Catalysts," Catalysis Letters 142(6), pp. 698-713, Jun. 2012.*
Xiong et al., "Ruthenium promotion of Co/SBA-15 catalysts with high cobalt loading for Fischer-Tropsch synthesis," Fuel Processing Technology 90(2), pp. 237-246, Feb. 2009.*
Aaltonen et al., "Ruthenium Thin Films Grown by Atomic Layer Deposition," Chemical Vapor Deposition 9(1), pp. 45-49, Jan. 2003.*
Aaltonen et al., "Atomic Layer Deposition of Platinum Thin Films," Chemistry of Materials 15(9), pp. 1924-1928, Apr. 2003.*
A. C. Jones, Chemical vapour deposition: precursors, processes and applications. Royal Society of Chemistry, 2009 (Overview, 37 pages).
P. Serp, Chemical vapor deposition methods for the controlled preparation of supported catalytic materials. Chemical reviews, 2002, vol. 102, Issue 9, pp. 3085-3128.
D. J. Emslie, Metal ALD and pulsed CVD: Fundamental reactions and links with solution chemistry. Coordination Chemistry Reviews, 2013, vol. 257, Issue 23, pp. 3282-3296.
J. Lu, Atomic layer deposition—Sequential self-limiting surface reactions for advanced catalyst "bottom-up" synthesis. Surface Science Reports, 2016, vol. 71, Issue 2, pp. 410-472.
S. M. George, Atomic layer deposition: an overview. Chemical reviews, 2010, vol. 110, Issue 1, pp. 111-131.
B. J. O'Neill, Catalyst design with atomic layer deposition. ACS Catalysis, 2015, vol. 5, Issue 3, pp. 1804-1825.
J. Hämäläinen, Atomic layer deposition of noble metals and their oxides. Chemistry of Materials, 2014, pp. 786-801.
S. H. Song, Influence of Ru segregation on the activity of Ru—Co/γ-Al $_2$O$_3$ during FT synthesis: a comparison with that of Ru—Co/SiO$_2$ catalysts. Catalysis Communications, 2008, vol. 9, Issue 13, pp. 2282-2286.
J. Y. Park, Ru promoted cobalt catalyst on γ-Al $_2$O$_3$ support: Influence of pre-synthesized nanoparticles on Fischer-Tropsch reaction. Journal of Molecular Catalysis A: Chemical, 2011, vol. 344, Issue 1, pp. 153-160.
A. W. Ott, Al2O3 thin film growth on Si (100) using binary reaction sequence chemistry. Thin Solid Films, 1997, 292 (1), 135-144.
T. Aaltonen, Atomic layer deposition of noble metals: Exploration of the low limit of the deposition temperature. Journal of materials research, 2004, vol. 19, Issue 11, pp. 3353-3358.
J. Lu, Toward atomically-precise synthesis of supported bimetallic nanoparticles using atomic layer deposition. Nature communications, 2014, vol. 5.

* cited by examiner

METHOD FOR DEPOSITION OF NOBLE METAL NANOPARTICLES ON CATALYSTS TO PROMOTE SAME, AND THE COMPOSITIONS SO PRODUCED

CROSS REFERENCE TO RELATED APPLICATION

The present invention claims priority from pending U.S. Provisional Patent Application Ser. No. 61/902,157, filed Nov. 9, 2013, entitled "Preferential chemical vapor deposition of noble metals nanoparticles on metals/metal oxides supported catalysts for promotion of carbon oxides hydrogenation," the subject matter of which is incorporated by reference herein in its entirety.

SPONSORSHIP STATEMENT

This application has been sponsored by the Iranian Nanotechnology Initiative Council, which does not have any rights in this application.

TECHNICAL FIELD

The present invention relates to an improved technique for chemical vapor deposition of noble metal nanoparticles on metals and metal oxides for promotion of supported catalysts, such as for carbon oxides hydrogenation.

BACKGROUND OF THE INVENTION

The advantageous or promoting effects of adding a second metal on supported cobalt and nickel catalysts have been reported in a number of studies. For example, higher carbon oxides hydrogenation activity, better active phase reducibility, and higher catalyst stability are some of the advantages of these promoter additions. Also, the promoters lower the temperature for the reduction of cobalt and nickel oxides to metallic cobalt and nickel, by the well-known mechanism of hydrogen spillover. Furthermore, the addition of small amounts of promoters to catalysts increases the dispersion and reducibility of active metals and achieves improved reaction conversion and selectivity.

Current promoted cobalt and nickel catalysts for carbon oxides hydrogenation are prepared by a traditional impregnation method. However, the preparation of promoted catalysts using these traditional or prior art impregnation methods may result in the promoters impregnating or depositing on both the active phase and the support.

Therefore, there is a present need for a technique to preferentially deposit promoters onto the catalyst active phase, with minimal or no deposition onto the support therefor. As a result, the highest promoting role of the second metal occurs when the promoter is only impregnated onto the cobalt or nickel active phase with close contacts, but not onto the support surface, which undermines the product.

It is, accordingly, an object of the present invention to provide an improved technique and method for the selective deposition of nobler metals onto the active phase components to the exclusion of the supports therefor.

This and other objects are met in various embodiment of the present invention where techniques are described that implement the focused deposition of the noble metals onto the active phase portions, offering significant advantages over the known prior art which are unable to do this.

SUMMARY OF THE INVENTION

The present invention relates to a method and technique for promoting supported catalysts using noble metal nanoparticles, along with the compositions so produced. For this purpose, different noble metal precursors are preferentially deposited onto supported metal catalysts, such as through chemical vapor deposition (CVD). Further, the promoted catalyst so produced is then used for CO and $CO_2$ hydrogenation reactions, increasing the reaction conversion, $C_{5+}$ compounds selectivity and chain growth probability. The active phase of the catalyst can be either cobalt oxide, nickel oxide or their reduced format ($Co^0$ or $Ni^0$), and the noble metal is preferably Ruthenium.

BRIEF DESCRIPTION OF THE DRAWINGS

While the specification concludes with claims particularly pointing out and distinctly claiming the subject matter that is regarded as forming the present invention, it is believed that the invention will be better understood from the following description taken in conjunction with the accompanying DRAWINGS, where like reference numerals designate like structural and other elements, in which:

DETAILED DESCRIPTION OF THE INVENTION

The following detailed description is presented to enable any person skilled in the art to make and use the invention. For purposes of explanation, specific nomenclature is set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown, but is to be accorded the widest possible scope consistent with the principles and features disclosed herein.

As discussed, prior art and traditional methods for the preparation of promoted catalysts generally result in promoter impregnation on both the active phase of the catalyst and the support. However, Applicant has found that the highest promoting role of precious noble metals occur when the promoter is only impregnated on the active phase, with close contacts but not onto the surfaces of the support. The present invention cures the serious impediments found in the prior art and traditional techniques.

As discussed, chemical vapor deposition (CVD) is preferably used for the addition of a promoter on the active phase surface of a catalyst with high bimetallic interaction, which, as noted, leads to higher catalytic performance than the prior art. Applicant has found that by fine tuning the temperature in a CVD temperature window, the noble metal precursor decomposes preferentially on the surface of the cobalt or nickel as the active phase of carbon oxides hydrogenation catalyst, with minimal amounts of noble metal deposition onto the surface of the support. Indeed, using the improved techniques of the present invention, the close contact between the catalyst active phase and the noble metal promoter greatly enhances the reducibility of the promoted catalysts and improves their activity and selectivity during hydrogenation reactions.

In a first embodiment of the present invention, chemical vapor deposition of ruthenocene is applied for preferential deposition of ruthenium onto the cobalt of a Fischer-Tropsch synthesis catalyst. The close contact between cobalt and ruthenium greatly enhances the reducibility of the Ru-promoted cobalt catalysts and improves their Fourier Transform Spectroscopy (FTS) activity and selectivity.

Figure 1:
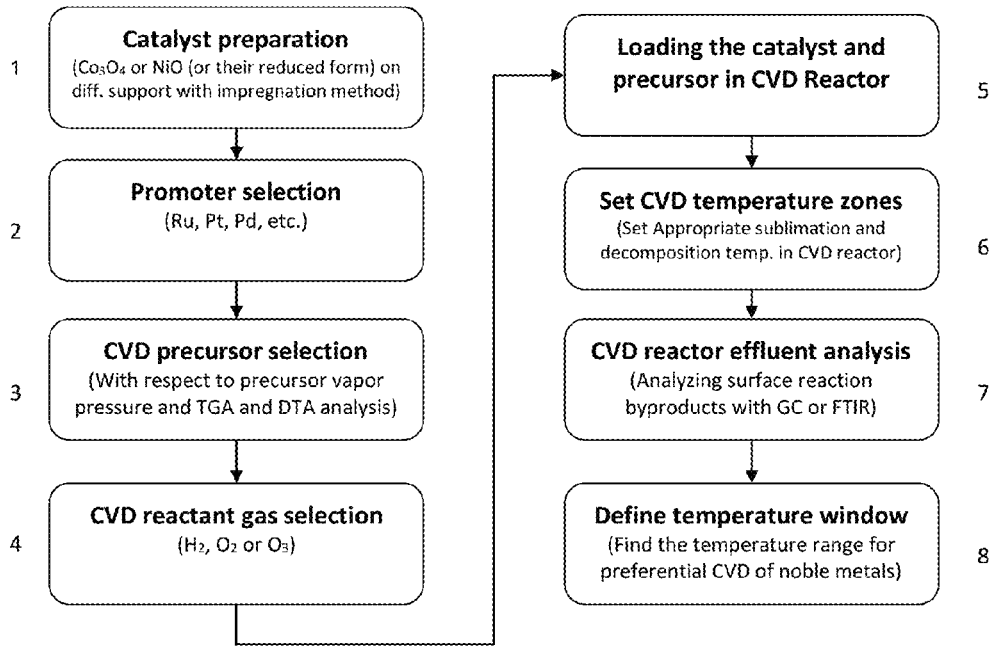
FIG. 1 is a representative illustration showing an exemplary hierarchical chart for an experimental procedure designed to find a preferred chemical vapor deposition (CVD) temperature window pursuant to the principles of the present invention.

A preferred experimental procedure designed to find the CVD temperature window is illustrated in an exemplary hierarchical chart in FIG. 1 of the DRAWINGS, which sets forth eight preferably sequential steps for the procedure, i.e., numbered 1-8, as shown and pursuant to the teachings of the present invention. Either a support (e.g., $\gamma$-$Al_2O_3$, $SiO_2$, $TiO_2$, SBA-15, carbon nanotubes or CNT) or a catalyst sample (e.g., supported $Co_3O_4$ or NiO) was placed in the deposition zone of CVD reactor, as shown and described in more detail hereinbelow in connection with FIG. 4. Argon was passed through the sublimation zone in the CVD reactor, to carry the noble metal precursor vapor, without any decomposition, to the deposition zone of CVD reactor and reacted with reactant gas (e.g., $H_2$, $O_2$ or $O_3$) on the surface of the sample. The CVD reactor effluents were then passed through a gas cell in an Fourier Transform Infrared (FTIR) or gas chromatography (GC) sample loop, as is understood in the art.

As noted, the thermochemical decomposition byproducts of noble metal precursors, on the support and the catalyst at various temperatures are detected by FTIR or GC. The special sublimation and decomposition temperature ranges which the noble metal precursor decomposition rates on the surface of catalyst (supported $Co_3O_4$ or NiO) are much higher than the surface of support, promise an intimate contact between the catalyst active phase and deposited noble metal. This temperature range is termed the "Preferential CVD Temperature Window," and is a central feature and object of the present invention. A detailed example, based on the aforesaid hierarch, is now presented for a CO hydrogenation (FTS) reaction.

$Co_3O_4$/$\gamma$-$Al_2O_3$ Catalyst Preparation

In this exemplary embodiment, an alumina-supported cobalt catalyst was prepared by impregnation of $\gamma$-$Al_2O_3$ with a cobalt nitrate aqueous solution. A sufficient amount of the cobalt nitrate was dissolved in de-ionized water to prepare about 15 wt % of cobalt onto the $\gamma$-$Al_2O_3$. The $\gamma$-$Al_2O_3$ was then immersed in a nitrate solution for about 1 hr, filtered, and dried in an evacuated oven at about 70° C. for about 4 hours, and then at about 120° C. overnight, afterwards calcined at about 400° C. for about 4 hours in air.

CVD Precursor Selection

In the present invention, ruthenocene was preferably used as precursor for the chemical vapor deposition of ruthenium. The ruthenocene vapor pressure equation is presented in equation (1):

$$\log_{10}(P[kPa]) = 13 - 5249.99/T[K] \quad (1)$$

According to equation (1), the vapor pressures of ruthenocene are 0.013 and 0.084 kPa, respectively, at 80 and 100° C., which are the temperatures of a ruthenocene sublimation zone employed in this study.

Figure 2:
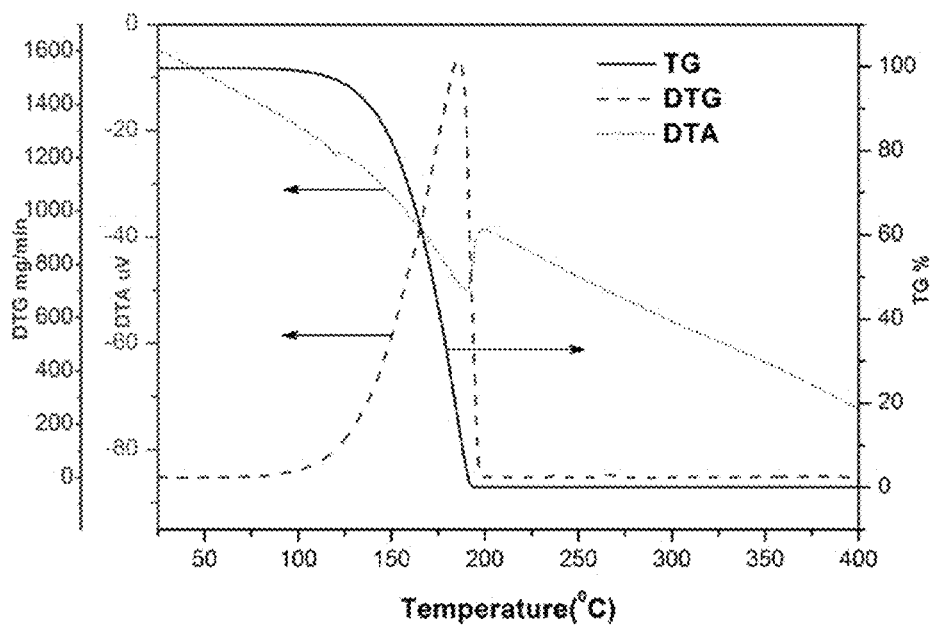
FIG. 2 illustrates exemplary thermogravimetry/differential thermal analysis (TG/DTA) and differential thermogravimetry (DTG) profiles of ruthenocene, such as in a nitrogen ($N_2$) atmosphere with a heating rate of about 5° C./min in one embodiment of the present invention.

A thermal gravimetric analysis (TGA) of ruthenocene is illustrated in FIG. 2 of the DRAWINGS. As shown, the TGA curve exhibited a one-step weight loss to zero in the range of about 100-200° C., accompanying a sharp differential thermogravimetry (DTG) endothermic peak at about same temperature range. This indicates that ruthenocene completely sublimes at temperatures lower than about 200° C. in Argon, with no ruthenium residue as a ruthenocene decomposition product.

CVD Reactant Gas Selection

Figure 3:
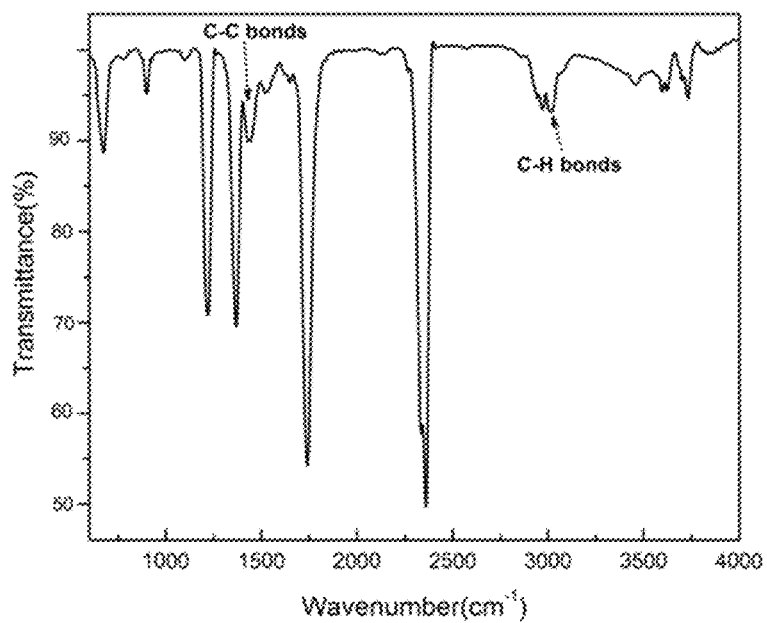
FIG. 3 illustrates a Fourier Transform Infrared (FTIR) spectrum or spectroscopy of the decomposition products of ruthenocene pursuant to an embodiment of the instant invention.

Hydrogen ($H_2$) was utilized to accelerate the decomposition of ruthenocene in the decomposition zone of the CVD reactor. A sample FTIR spectrum of ruthenocene thermochemical destruction products in the region of about 400-4000 $cm^{-1}$ is depicted in FIG. 3 of the DRAWINGS.

CVD setup for Ru deposition on $Co_3O_4$/$\gamma$-$Al_2O_3$

Figure 4:
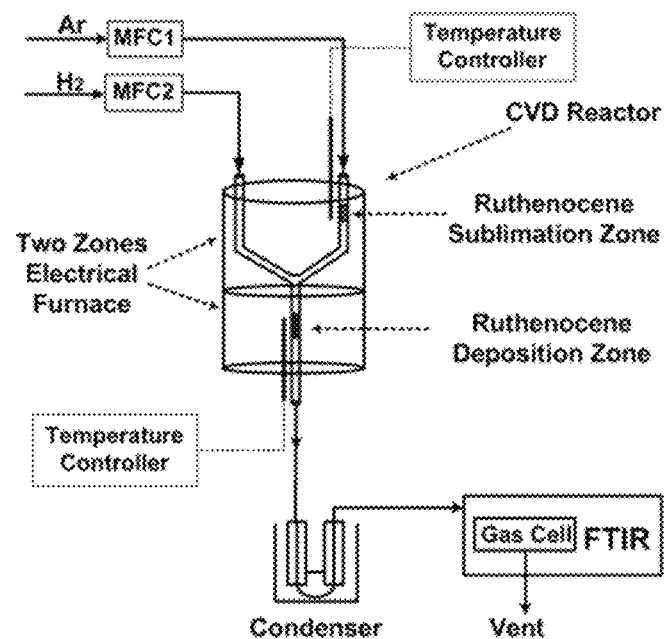
FIG. 4 is a schematic illustration of a chemical vapor deposition (CVD) experimental setup for practicing the principles of the present invention.

With reference now to FIG. 4 of the DRAWINGS, there is illustrated an exemplary CVD experimental setup used for a presently-preferred technique for the deposition of ruthenium on $Co_3O_4$/$\gamma$-$Al_2O_3$ pursuant to the principles of the instant invention. As shown, the setup includes respective Argon (Ar) and a hydrogen ($H_2$) feeding sections, a ruthenocene sublimation zone, a ruthenocene deposition zone, a condenser, and a gas cell in an FTIR for analysis of ruthenocene decomposition products in the effluent gases.

As shown in FIG. 4, the feeding section has two mass flow controllers (MFC1 and MFC2) used to adjust the flow rates of Argon (Ar) and hydrogen ($H_2$), respectively. A preferably Quartz CVD reactor includes the two lines for feeding the carrier gas (Ar) and the reactant gas ($H_2$). Furthermore, the furnace preferably has two different temperature zones for the ruthenocene sublimation and decomposition, as shown by the arrows in FIG. 4. First, Ruthenocene is loaded into the sublimation zone of the CVD reactor, with Ar as the carrier gas. The Ruthenocene carried by the argon reaches the catalyst ($Co_3O_4$/$Al_2O_3$ samples, without prior reduction) loaded into the subsequent deposition zone in the CVD reactor, as shown, the temperature of which is high enough for the decomposition of the aforesaid ruthenocene with the aid of the $H_2$ reactant gas. The reactor effluent gases were passed through the condenser to remove any unreacted organometallic compounds, and passed through a gas cell in an FTIR, which detects the decomposition products of ruthenocene, as described.

Preferential CVD of Ruthenium on Cobalt of Co/γ-$Al_2O_3$

As discussed, the present invention is directed to improved techniques to preferentially decompose ruthenocene on the surface of the cobalt, as the active phase of Co/γ-$Al_2O_3$ catalyst, with minimal or no amounts of ruthenium being deposited onto the surface of the alumina support. As discussed, this objective can be achieved by fine-tuning the temperature in a CVD temperature window. The following experimental procedure was designed to find the preferred CVD temperature windows pursuant to the teachings of the present invention.

Either a γ-$Al_2O_3$ support or a $Co_3O_4$/γ-$Al_2O_3$ catalyst sample was placed in the deposition zone of CVD reactor, as shown and described in connection with FIG. 4. Argon was passed through the sublimation zone in CVD reactor, to carry the ruthenocene vapor, without any decomposition, to the deposition zone of CVD reactor, and reacted with hydrogen on the surface of the sample. The CVD reactor effluents were passed through the gas cell in the FTIR. The FTIR patterns for ruthenocene decomposition products on the γ-$Al_2O_3$ and the $Co_3O_4$/γ-$Al_2O_3$, at various temperatures, for both C—C bonds and C—H bonds, are detected.

Figure 5:
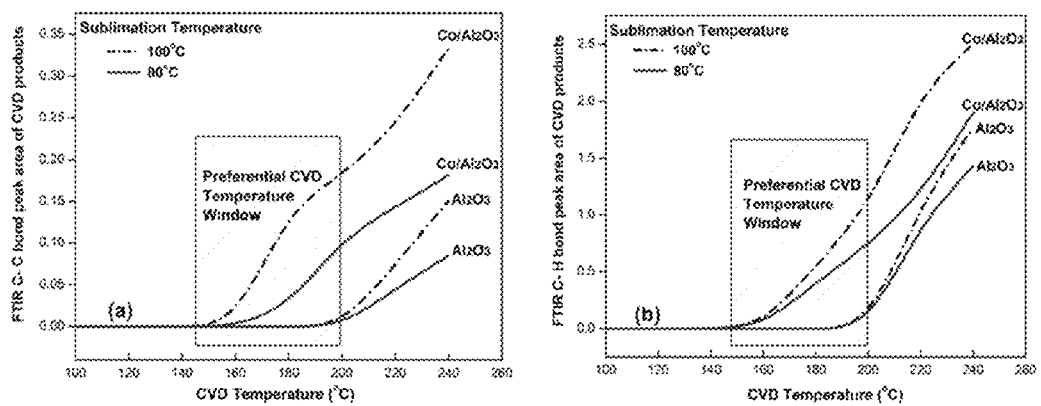
FIG. 5 illustrates the areas of Fourier Transform Infrared (FTIR) absorbance for two scenarios in embodiments of the present invention, namely: (a) illustrating C—C bond peak areas, and (b) illustrating C—H bond peak areas, at various sublimation and decomposition temperatures for both $\gamma$-$Al_2O_3$ and Co/$\gamma$-$Al_2O_3$. A preferential CVD temperature window indicates the temperature range at which no ruthenocene decomposition occurs on the $\gamma$-$Al_2O_3$, while significant decomposition occurs on Co/$\gamma$-$Al_2O_3$.

With reference now to FIG. 5 of the DRAWINGS, particularly the two graphs shown in the Figure, the areas under C—C and C—H show absorbances in the ranges of about 2900-3100 and about 1300-1500 $cm^{-1}$, respectively, which are plotted versus the decomposition zone temperature.

Applicant has found that for all sublimation and decomposition temperatures, the ruthenocene decomposition rates on the $Co_3O_4$/γ-$Al_2O_3$ catalyst are significantly higher than those on γ-$Al_2O_3$., with the effect more pronounced at lower temperatures. In all cases, in the range of about 150-200° C., no ruthenocene decomposition occurs on the γ-$Al_2O_3$, while significant decomposition occurs on the $Co_3O_4$/γ-$Al_2O_3$. This temperature range, illustrated more particularly within the boxed sections within the two graphs, are labeled "Preferential CVD Temperature Window." Cobalt oxide dispersed on the γ-$Al_2O_3$ seems to catalyze the ruthenocene decomposition. This promises an intimate contact between the cobalt active phase and deposited ruthenium.

CVD Operating Conditions

It should be understood that CVD experiments were performed at a sublimation temperature of about 80° C. and at a decomposition temperature of about 180° C. in about 15 sccm argon and about 50 sccm hydrogen, respectively. Also, 0.4 g calcined 15 wt % Co/γ-$Al_2O_3$ catalysts were promoted by Ru-contents of 0.05, 0.1, 0.15, 0.2 and 0.3 wt % Co by varying the preferential CVD times.

As Applicant can be their own lexicographer, for convenience and clarity, the abbreviated name for 15 wt % $Co_3O_4$/γ-$Al_2O_3$ is CoRu0 and the promoted catalysts with 0.05 to 0.3 wt % of ruthenium are termed CoRu1 to CoRu5 (denoted CoRu5-180), respectively. Another CoRu5 sample was prepared by ruthenocene CVD at 225° C. (denoted as CoRu5-225), which is beyond the "preferential CVD temperature window" and ruthenocene decomposes on both alumina and cobalt oxide on alumina. FTIR spectrum shows the presence of ruthenocene decomposition products on alumina, as shown in FIG. 5.

For comparison of a preferential CVD with the usual impregnation method, the CoRu5-SI, corresponding to a CoRu5 sample prepared by the CVD method, was prepared by impregnation of a RuCl3 solution onto the calcined $Co_3O_4$/γ-$Al_2O_3$. The sample was dried and then calcined at the same temperature of 400° C.

EXAMPLE 1

Properties of the Prepared CoRu$x$ Containing Catalysts

Figure 6:
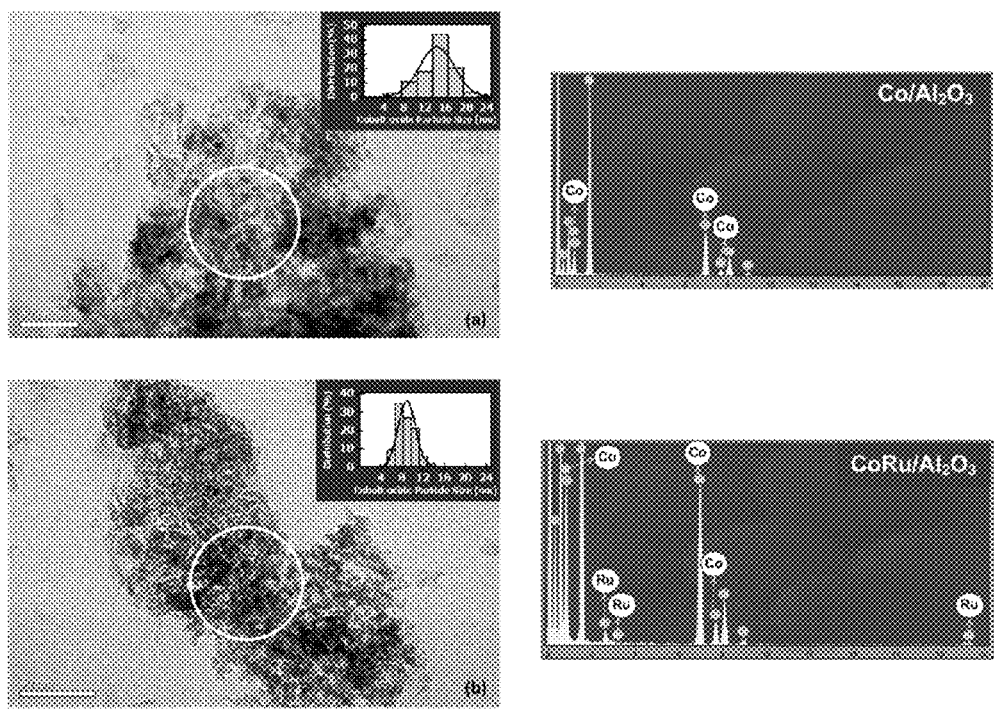
FIG. 6 illustrates respective Transmission Electron Microscopy (TEM), with nanoparticle size distribution inserts, and corresponding Energy Dispersive X-Ray (EDX) patterns for two scenarios, namely: (a) a CoRu0 unpromoted catalyst, and (b) a CoRu5 catalyst promoted with 0.3 wt % Ru, pursuant to the teachings of the instant invention.

With reference now to FIG. 6 of the DRAWINGS, there are shown Transmission Electron Microscopy (TEM) micrographs and Energy Dispersive X-Ray (EDX) analyses of CoRu5 containing about 0.3 wt % ruthenium and those of CoRu0. As shown, the EDX analysis of CoRu5 confirms the presence of ruthenium in the sample. The cobalt oxide nanoparticles size distributions of the samples are also shown in FIG. 6 insets within the respective TEM micrographs. As about 0.3 wt % Ru is added to the CoRuO, the average cobalt oxide nanoparticles sizes reduces from 14.4 to 8.9 nm and their distribution shifts to lower values and narrows down.

Figure 7:
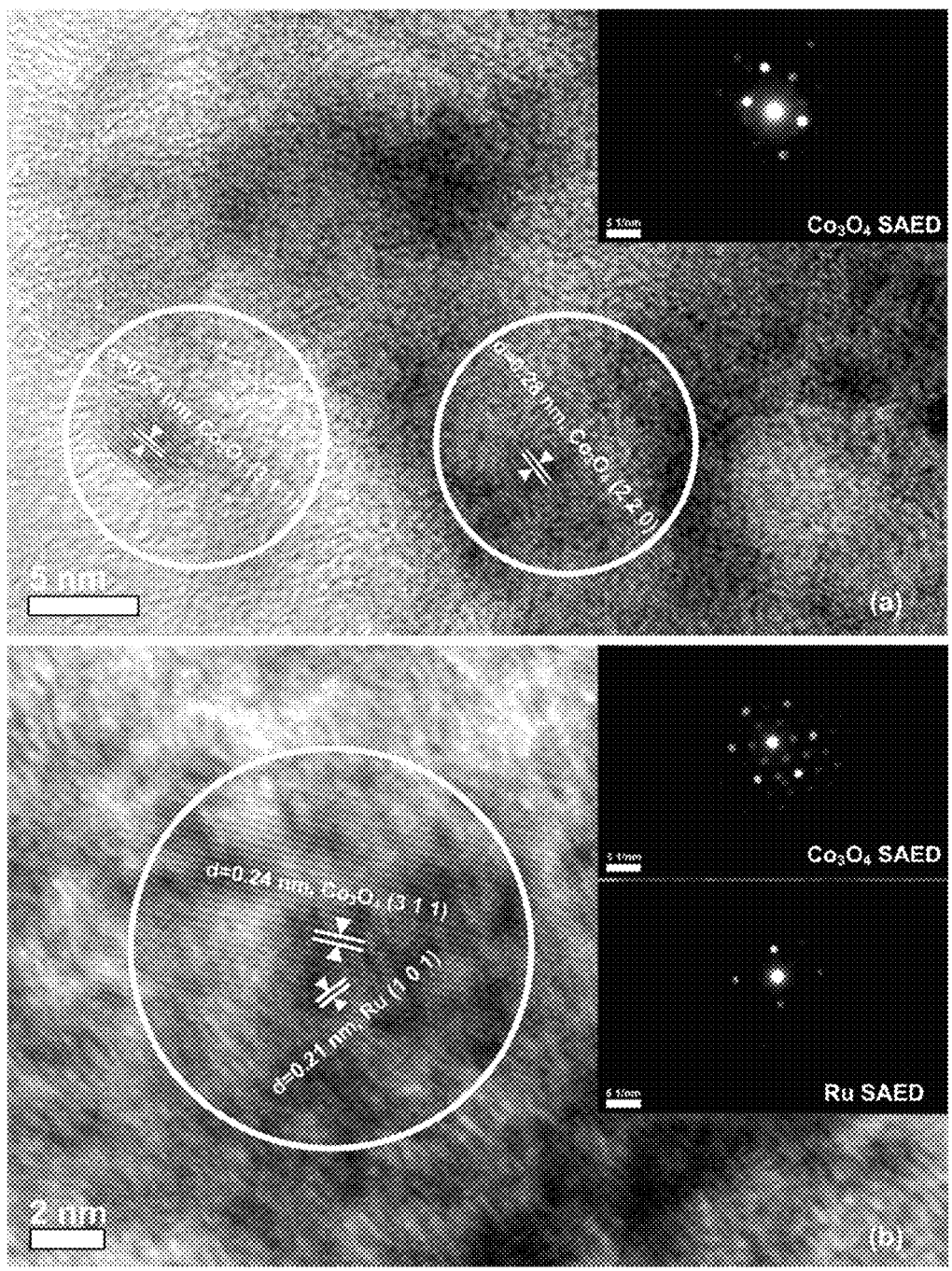
FIG. 7 illustrates lattice fringes of (a) a CoRu0 unpromoted catalyst and (b) a CoRu5 catalyst with 0.3 wt % Ru, as set forth hereinabove and described further hereinbelow in connection with FIG. 6 of the DRAWINGS, along with respective electron diffraction analyses (SAED) insets.

Lattice fringes of CoRuO unpromoted catalyst and CoRu5 sample promoted with 0.3 wt % Ru are shown in FIG. 7 of the DRAWINGS. It should be understood that about 0.21 nm lattice fringes in CoRu5 samples can be attributed to Ru (1 0 1) crystallites, which are in intimate contact with cobalt oxide nanoparticles.

An X-Ray diffraction (XRD) analysis, along with respective selected area electron diffraction analyses (SAEDs), was applied to investigate the effect of ruthenium on average $Co_3O_4$ crystallite sizes of the calcined Ru-Co/γ-$Al_2O_3$ catalysts. As shown, the crystallite size of $Co_3O_4$ decreases from about 15.8 to 8.9 nm, as the Ru content increases from about 0 to 0.3 wt % of cobalt, respectively. Table 1 hereinbelow indicates that the cobalt dispersion increases with the ruthenium content of catalysts. Also, as the ruthenium content of the catalysts increases to about 0.3 wt %, the surface area of the catalysts increases by about 37%. This may be due to a decrease in the cobalt oxide particle sizes, in accordance with the aforesaid XRD results.

TABLE 1

Average $Co_3O_4$ crystallite size, Co° crystallite size, dispersion and specific surface area of the catalysts samples.

| Catalyst | Nominal Ru content (wt % Co) | CVD time (mn) | Specific Surface area ($m^2$/gr) | $Co_3O_4$ Crystallite size$^a$ (nm) | Co° Crystal size$^b$ (nm) | Dispersion$^c$ (%) | Hydrogen consumption in TPR (μmol $H_2$/g. catal.) |
|---|---|---|---|---|---|---|---|
| γ-$Al_2O_3$ | — | — | 195 | — | — | — | — |
| CoRu0 | 0.00 | — | 138 | 15.8 | 11.9 | 8.1 | 1772 |
| CoRu1 | 0.05 | 5 | 178 | 14.2 | 10.7 | 9.0 | 2300 |

TABLE 1-continued

Average $Co_3O_4$ crystallite size, $Co°$ crystallite size, dispersion and specific surface area of the catalysts samples.

| Catalyst | Nominal Ru content (wt % Co) | CVD time (mn) | Specific Surface area (m²/gr) | $Co_3O_4$ Crystallite size$^a$ (nm) | $Co^0$ Crystal size$^b$ (nm) | Dispersion$^c$ (%) | Hydrogen consumption in TPR (μmol H$_2$/g. catal.) |
|---|---|---|---|---|---|---|---|
| CoRu2 | 0.1 | 10 | 180 | 12.9 | 9.7 | 9.9 | 2474 |
| CoRu3 | 0.15 | 15 | 183 | 11.8 | 8.9 | 10.8 | 2599 |
| CoRu4 | 0.2 | 20 | 184 | 10.1 | 7.6 | 12.6 | 2757 |
| CoRu5 | 0.3 | 30 | 189 | 8.9 | 6.7 | 14.3 | 3167 |
| CoRu5-SI | 0.3 | — | 182 | 12 | 9 | 10.6 | 2698 |

Figure 8:
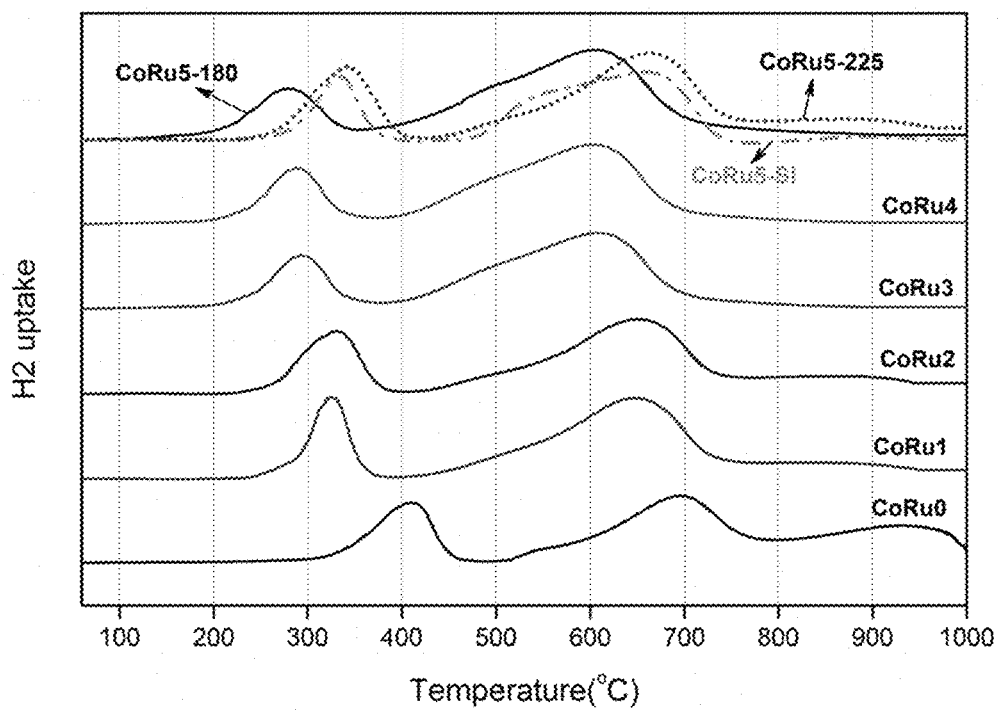
FIG. 8 illustrates various temperature programmed reaction (TPR) profiles for unpromoted and ruthenium promoted catalysts pursuant to embodiments of the present invention.

$^a Co_3O_4$ crystallite size is determined using Scherrer's equation at $2\theta = 36.8$
$^b Co°$ and $Co_3O_4$ crytstallites size are related by $d(Co°) = 0.75 d(Co_3O_4)$
$^c \% D = 96/d(Co°)$ With reference now to FIG. 8 of the DRAWINGS, there are illustrated various TPR profiles for Co/γ-Al$_2$O$_3$ catalyst and the ones promoted with ruthenium. As is known in the art, the presence of ruthenium in all of the catalysts shifts the two main reduction peaks to lower temperatures. Thus, the more ruthenium is deposited on the Co/γ-Al$_2$O$_3$, the more the TPR peaks shift to lower temperatures. The ruthenium structural promotion requires intimate contact between cobalt and ruthenium components. The promotion of supported cobalt catalysts with ruthenium, using the traditional, prior art impregnation method, apparently leads to the migration of ruthenium onto the catalyst active phase, as well as the support. As shown in the present invention, the promotional effect can be enhanced if the ruthenium has a close contact with the cobalt active phase. The preferred CVD method and techniques set forth in the present invention provides conditions for preferential deposition of ruthenium on the surface of the cobalt active phase rather than γ-alumina support. This intimate contact between ruthenium and cobalt significantly decreases the first and second peak temperatures in TPR profile. As compared to CoRuO, the first and second TPR peaks of CoRu5-180, as prepared by the preferred CVD herein, are shifted by 134 and 120° C. to lower temperatures, while that of CoRu5-SI, prepared by the traditional impregnation method are shifted by much lower values of 80 and 50° C., respectively, due to a better structural promotion of ruthenium in CoRu5 sample. In addition, as compared to CoRu5-180, the cobalt oxides reduction peaks of CoRu5-225 have shifted to higher temperatures as those of CoRu5-SI. This indicates that a significant amount of Ru is deposited on the alumina without intimate contact with cobalt oxide.

EXAMPLE 2

The use of Promoted Catalyst for CO Conversion

CO conversion, product selectivity and chain growth probability (a), as well as olefin to paraffin ratio in C$_2$-C$_4$ hydrocarbons, for the Fischer-Tropsch synthesis (FTS) on the various catalysts at 220° C. and H$_2$/CO=2, and mean space time of 4 s are summarized in Table 2 hereinbelow.

As shown, as the ruthenium content increases from 0 in CoRu0 to 0.3 wt % Ru in CoRu5, several things occur: (a) the CO conversion increases by 2.8 times, (b) the selectivity to methane (as one of the most undesirable products) decreases by about 28%, (c) in accordance to a, the selectivity to C$_{5+}$ as the most desirable FTS products increases by 46.4%, (d) the O/P ratio decreases by 2.4 times, and (e) the selectivity to C$_2$-C$_4$ does not change significantly.

It is also observed that, in addition to the beneficial aspects noted hereinabove, C$_{5+}$ selectivity increases by adding ruthenium by the preferential CVD method. As compared to CoRu5-180, the corresponding CoRu5-SI prepared by the traditional impregnation method has higher CH$_4$ and lower C$_{5+}$ selectivities and about 45% lower CO conversion. Also, significantly lower CO conversion and C$_{5+}$ selectivity are observed for CoRu5-225.

Therefore, the CoRu5-180 catalyst has 270% higher C$_{5+}$ yields than the CoRuO unpromoted cobalt catalyst which is much higher than C$_{5+}$ yields of CoRu5-SI prepared by the traditional impregnation method that has 82% higher C$_{5+}$ yields with respect to CoRuO sample.

TABLE 2

Catalytic performances of Co/γ-Al$_2$O$_3$ with different Ru content.

| Catalysts | CO Conversion (%) | Selectivity | | | α | (O/P) % | Carbon Balance |
| | | C$_1$ | C$_2$-C$_4$ | C$_{5+}$ | | | |
|---|---|---|---|---|---|---|---|
| CoRu0 | 15.3 | 37 | 29 | 34 | 0.64 | 8.1 | 99.9 |
| CoRu1 | 24.7 | 29.9 | 28 | 42.1 | 0.70 | 5.1 | 99.6 |
| CoRu2 | 26.8 | 27.9 | 28.2 | 43.9 | 0.73 | 4.7 | 99.2 |
| CoRu3 | 31.1 | 26.9 | 26.7 | 46.4 | 0.73 | 4.6 | 99.4 |
| CoRu4 | 40.1 | 26.8 | 28.9 | 44.3 | 0.73 | 3.4 | 99.5 |
| CoRu5-180 | 42.9 | 26.6 | 28.5 | 44.9 | 0.74 | 3.4 | 99.9 |
| CoRu5-225 | 28.8 | 27.1 | 30.6 | 42.3 | 0.72 | 4.4 | 99.1 |
| CoRu5-SI | 23.7 | 28 | 32 | 40 | 0.68 | 5.1 | 99.3 |

*Reaction Conditions: T = 220° C., P = 1 bar, H$_2$/CO = 2, τ = 4 s

While the present invention has been illustrated by the description of the embodiments thereof, and while the embodiments have been described in detail, it is not the intention of the Applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departure from the breadth or scope of the applicant's concept. Furthermore, although the present invention has been described in connection with a number of exemplary embodiments and implementations, the present invention is not so limited but rather covers various modifications and equivalent arrangements, which fall within the purview of the appended claims.

What is claimed is:

1. A method for producing a catalyst comprising:
forming, on a support surface, an active metal surface of a precursor catalyst, wherein: the active metal surface of the precursor catalyst is selected from the group consisting of cobalt oxide, nickel oxide, reduced formats ($Co^0$ or $Ni^0$) and combinations thereof, and the support surface of the precursor catalyst is made of a material selected from the group consisting of $\gamma$-$Al_2O_3$, $TiO_2$, carbon nanotubes or CNT, and combinations thereof; and depositing, via chemical vapor deposition, ruthenium metal nanoparticles onto the active metal surface, the depositing including reacting on the active metal surface of the precursor catalyst a ruthenium metal precursor vapor with a reactant gas, at a reacting temperature at which the precursor catalyst catalyzes a decomposition of the ruthenium metal precursor vapor into ruthenium metal nanoparticles, wherein the reacting temperature is below a temperature at which the ruthenium metal precursor vapor substantially deposits ruthenium metal nanoparticles upon the support surface of said precursor catalyst, and wherein the reacting temperature is within the range of about 150° C. to about 200° C.

2. The method according to claim 1, wherein the precursor catalyst is an alumina-supported cobalt catalyst.

3. The method according to claim 1, wherein said ruthenium is about 0.01% to 1% by weight of active metal.

4. The method according to claim 3, wherein said ruthenium is about 0.05% to 0.3% by weight of active metal.

5. The method according to claim 1, wherein the ruthenium metal nanoparticles are carried by Argon gas to said precursor catalyst.

6. The method according to claim 1, further comprising heating a sublimation zone of a chemical vapor deposition assembly to about 80° C.

7. The method according to claim 1, further comprising obtaining an Fourier Transform Infrared (FTIR) pattern of the ruthenium metal nanoparticles that have decomposed during the chemical vapor deposition.

8. A method for producing a catalyst comprising:
depositing ruthenium metal nanoparticles onto first support surfaces using chemical vapor deposition of a ruthenium metal precursor to produce a first effluent;
depositing ruthenium metal nanoparticles onto a first precursor catalyst using chemical vapor deposition of the ruthenium metal precursor to produce a second effluent, the first precursor catalyst including first active metal surfaces and second support surfaces;
obtaining an Fourier Transform Infrared (FTIR) pattern of the first effluent and the second effluent for temperatures between 100° C. and 280° C.; and
determining a preferential temperature range that extends between a first temperature and a second temperature, the first temperature corresponding to a temperature at which decomposition of the ruthenium metal precursor is detected in the second effluent, the second temperature corresponding to a temperature at which decomposition of the ruthenium metal precursor is detected in the first effluent,
wherein the chemical vapor deposition of the ruthenium metal precursor in the preferential temperature range preferentially deposits ruthenium metal nanoparticles upon the first active metal surfaces and minimally deposits ruthenium metal nanoparticles upon the second support surfaces of the first precursor catalyst.

9. The method of claim 1, wherein the ruthenium metal precursor vapor includes ruthenocene vapor.

10. The method of claim 1, wherein the reactant gas includes hydrogen.

11. The method of claim 1, wherein the depositing further includes:
concurrently carrying the ruthenium metal precursor vapor and the reactant gas onto the active metal surface of the precursor catalyst.

* * * * *